United States Patent
Moden et al.

(10) Patent No.: US 6,346,152 B1
(45) Date of Patent: Feb. 12, 2002

(54) METHOD AND APPARATUS FOR APPLYING ADHESIVES TO A LEAD FRAME

(75) Inventors: Walter L. Moden, Meridian; Syed S. Ahmad, Boise; Gregory M. Chapman, Meridian; Tongbi Jiang, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/405,943

(22) Filed: Sep. 27, 1999

Related U.S. Application Data

(63) Continuation of application No. 08/906,673, filed on Aug. 5, 1997, now Pat. No. 6,013,535.

(51) Int. Cl.[7] .................................................. B05C 3/00
(52) U.S. Cl. ..................... 118/422; 118/429; 118/712
(58) Field of Search ................................. 118/693, 694, 118/412, 421, 422, 423, 712, 429, 683; 427/96, 98, 207.1, 434.3, 436

(56) References Cited

U.S. PATENT DOCUMENTS

| | | |
|---|---|---|
| 4,045,863 A | 9/1977 | Mitterhummer et al. |
| 4,346,124 A | 8/1982 | Wood et al. |
| 4,355,463 A | 10/1982 | Burns |
| 4,687,693 A | 8/1987 | Sheyon et al. |
| 4,862,245 A | 8/1989 | Pashby et al. |
| 4,876,221 A | 10/1989 | Hatada |
| 4,959,008 A | 9/1990 | Wasulko |
| 5,030,308 A | 7/1991 | Sheyon et al. |
| 5,049,434 A | 9/1991 | Wasulko |
| 5,066,614 A | 11/1991 | Dunaway et al. |
| 5,139,973 A | 8/1992 | Nagy et al. |
| 5,140,404 A | 8/1992 | Fogal et al. |
| 5,256,598 A | 10/1993 | Farnworth et al. |
| 5,286,679 A | 2/1994 | Farnworth et al. |
| 5,302,849 A | 4/1994 | Cavasin |
| 5,304,842 A | 4/1994 | Farnworth et al. |
| 5,322,207 A | 6/1994 | Fogal et al. |
| 5,409,863 A | 4/1995 | Newman |
| RE35,027 E | 8/1995 | Regard |
| 5,482,736 A | 1/1996 | Glenn et al. |
| 5,548,160 A | 8/1996 | Corbett et al. |
| 5,563,443 A | 10/1996 | Beng et al. |
| 5,585,282 A | 12/1996 | Wood et al. |
| 5,696,033 A | 12/1997 | Kinsman |
| 5,725,143 A  * | 3/1998 | Leturmy ...................... 228/37 |
| 5,733,800 A | 3/1998 | Moden |
| 5,739,053 A | 4/1998 | Kawakita et al. |
| 5,773,322 A | 6/1998 | Weld |
| 5,810,926 A | 9/1998 | Evers |
| 5,834,062 A | 11/1998 | Johnson et al. |
| 5,923,957 A | 7/1999 | Song et al. |

\* cited by examiner

*Primary Examiner*—Brenda A. Lamb
(74) *Attorney, Agent, or Firm*—TraskBritt

(57) ABSTRACT

A method for applying a viscous material to a lead frame element. A method of the invention includes positioning the lead frame facing downward and bringing the lead fingers into contact with a pool of adhesive material. The contact of the lead fingers to the adhesive material results in a portion of the lead fingers receiving a portion of the adhesive material from the pool of adhesive material. The gravitational forces on the adhesive material on the downward facing lead frame maintain the shape and boundary definition of the adhesive material.

99 Claims, 10 Drawing Sheets

METHOD AND APPARATUS FOR APPLYING ADHESIVES TO A LEAD FRAME

CROSS REFERENCE TO RELATED APPLICATION

This application is a continuation of application Ser. No. 08/906,673, filed Aug. 5, 1997, now U.S. Pat. No. 6,013,535.

BACKGROUND OF THE INVENTION

1. Field of the Invention

The present invention relates to applying viscous materials to lead fingers of a lead frame, such as an adhesive material for the attachment of the lead fingers to a semiconductor die. More particularly, the present invention relates to applying adhesive material to the lead fingers by contacting the lead fingers with a pool of adhesive material.

2. State of the Art

Higher performance, lower cost, increased miniaturization of semiconductor components, and greater packaging density of integrated circuits are goals of the computer industry. One way to reduce the overall cost of a semiconductor component is to reduce the manufacturing cost of that component. Lower manufacturing costs can be achieved through faster production and/or reduction in the amount of materials used in fabricating the semiconductor component.

One area where faster production and reduction in material usage can be achieved is in the area of lead frame attachment to semiconductor dice. U.S. Pat. No. 5,286,679 issued Feb. 15, 1994 to Farnworth et al. ("the '679 patent"), assigned to the assignee of the present invention and hereby incorporated herein by reference, teaches attaching leads to a semiconductor device with adhesive material in a "lead-over-chip" ("LOC") configuration. The '679 patent teaches applying a patterned thermoplastic or thermoset adhesive layer to a semiconductor wafer. The adhesive layer is patterned to keep the "streets" on the semiconductor wafer clear of adhesive for saw cutting and to keep the wire bonding pads on the individual dice clear of adhesive for wire bonding. Patterning of the adhesive layer is generally accomplished by hot or cold screen/stencil printing or dispensing by roll-on. Following the printing and baking of the adhesive layer on the semiconductor wafer, the individual dice are singulated from the semiconductor wafer. During packaging, each adhesive coated die is attached to lead fingers of a lead frame by heating the adhesive layer and pressing the lead fingers onto the adhesive. If the adhesive layer is formed of a thermoset material, a separate oven cure is required. Furthermore, the adhesive layer may be formulated to function as an additional passivating/insulating layer or alpha barrier for protecting the packaged die.

Although the teaching of the '679 patent is an effective method for attaching leads in a LOC configuration, it is difficult to achieve an adequate profile on the adhesive such that there is sufficient area on the top of the adhesive to attach the lead fingers. The process disclosed in the '679 patent is illustrated in FIGS. 14–20. FIG. 14 illustrates a side, cross-sectional view of a semiconductor substrate 302 with a bond pad 304, wherein a stencil or a screen print template 306 has been placed over the semiconductor substrate 302, generally a silicon wafer. The stencil or screen print template 306 is patterned to clear the area around the bond pads 304 and to clear street areas 308 for saw cutting (i.e., for singulating the substrate into individual dice). An adhesive material 310 is applied to the stencil or screen print template 306, as shown in FIG. 15. Ideally, when the stencil or screen print template 306 is removed, adhesive prints 312 are formed with vertical sidewalls 314 and a planar upper surface 316, as shown in FIG. 16. However, since the adhesive material 310 must have sufficiently low viscosity to flow and fill the stencil or screen print template 306, as well as allow for the removal of the stencil or screen print template 306 without the adhesive material 310 sticking thereto, the adhesive material 310 of the adhesive prints 312 will spread, sag, or flow laterally under the force of gravity after the removal of the stencil or screen print template 306, as shown in FIG. 17. This post-application flow of adhesive material 310 can potentially cover all or a portion of the bond pads 304 or interfere with the singulating of the semiconductor wafer by flowing into the street areas 308.

Furthermore, and of even greater potential consequence than bond pad or street interference is the effect that the lateral flow or spread of adhesive material 310 has on the adhesive material upper surface 316. As shown in FIG. 18, the adhesive material upper surface 316 is the contact area for lead fingers 318 of a lead frame 320. The gravity-induced flow of the adhesive material 310 causes the once relatively well-defined edges 322 of the adhesive material to curve, resulting in a loss of surface area 324 (ideal shape shown in shadow) for the lead fingers 318 to attach. This loss of surface area 324 is particularly problematical for the adhesive material upper surface 316 at the longitudinal ends 326 thereof. At the adhesive material longitudinal ends 326, the adhesive material flows in three directions (to both sides as well as longitudinally), causing a severe curvature 328, as shown in FIGS. 19 and 20. The longitudinal ends of the adhesive print on patch flow is a 180° flow front, resulting in blurring of the print boundaries into a curved perimeter. This curvature 328 results in complete or near complete loss of effective surface area on the adhesive material upper surface 316 for adhering the outermost lead finger closest to the adhesive material longitudinal end 326 (lead finger 330). This results in what is known as a "dangling lead." Since the lead finger 330 is not adequately attached to the adhesive material longitudinal end 326, the lead finger 330 will move or bounce when a wire bonding apparatus (not shown) attempts to attach a bond wire (not shown) between the lead finger 330 and its respective bond pad 304 (shown from the side in FIG. 20). This movement can cause inadequate bonding or non-bonding between the bond wire and the lead finger 330, resulting in the failure of the component due to a defective electrical connection.

LOC attachment can also be achieved by attaching adhesive tape, preferably insulative, to an active surface of a semiconductor die, then attaching lead fingers to the insulative tape. As shown in FIG. 21, two strips of adhesive tape 410 and 410' are attached to an active surface 412 of a semiconductor die 404. The two adhesive tape strips 410, 410' run parallel to and on opposing sides of a row of bond pads 406. Lead fingers 402, 402' are then attached to the two adhesive tape strips 410, 410', respectively. The lead fingers 402, 402' are then electrically attached to the bond pads 406 with bond wires 408. Although this method is effective in attaching the lead fingers 402, 402' to the semiconductor die 404, this method is less cost effective than using adhesive since the cost of adhesive tape is higher than the cost of adhesive material. The higher cost of the adhesive tape is a result of the manufacturing and placement steps which are required with adhesive tapes. The individual tape segments are generally cut from a larger tape sheet. This cutting requires precision punches with extremely sharp and accurate edges. These precision punches are expensive and they wear out over time. Furthermore, there is always waste between the segments which are punched out, resulting in high scrap cost. Moreover, once punch out is complete, the tape segments are placed on a carrier film for transport to the die-attach site. Thus, there are problems with placement, alignment, and attachment with film carriers, plus the cost of the film carrier itself.

LOC attachment can further be achieved by placing adhesive material on the lead fingers of the lead frame rather than on the semiconductor substrate. As shown in FIG. 22, the adhesive material 502 may be spray applied on an attachment surface 504 of lead fingers 506. However, the viscous nature of the adhesive material 502 results in the adhesive material 502 flowing down the sides 508 of the lead finger 506 and collecting on the reverse, bond wire surface 510 of the lead finger 506, as shown in FIG. 23. The adhesive material 502, which collects and cures on the bond wire surface 510, interferes with subsequent wire bonding, which, in turn, can result in a failure of the semiconductor component. The flow of adhesive material 502 for the attachment surface 504 to the bond wire surface 510 can be exacerbated if the lead fingers 506 are formed by a stamping process rather than by etching, the other widely employed alternative. The stamping process leaves a slight curvature 512 to edges 514 of at least one surface of the lead finger 506, as shown in FIG. 24. If an edge curvature 512 is proximate the lead finger attachment surface 504, the edge curvature 512 results in less resistance (i.e., less surface tension) to the flow of the adhesive material 502. This, of course, results in the potential for a greater amount of adhesive material 502 to flow to the bond wire surface 510.

Furthermore, present methods of adhesive material application on a surface (whether the semiconductor die or the lead fingers) tend to waste adhesive material. For example, spray application loses a great deal of adhesive material because not all of the sprayed adhesive material attaches to the target surface. As another example, the patterning of an adhesive layer on a semiconductor die, such as described in the '679 patent, results in a substantial area of the adhesive pattern not being utilized to attach leads.

Thus, it can be appreciated that it would be advantageous to develop a method and apparatus for rapidly applying an adhesive material to a lead finger with little waste of adhesive material.

SUMMARY OF THE INVENTION

The present invention relates to a method for applying a viscous material, such as an adhesive material, to lead fingers of a lead frame wherein surfaces of the lead fingers which receive the viscous material face downward to contact a pool of adhesive material. Preferably, the viscous material is an adhesive material which cures with the lead frame in this downward facing position. The advantages of placing viscous material, such as an adhesive material, in a downward facing position are described in U.S. patent application Ser. No. 08/709,182 by Tongbi Jiang and Syed S. Ahmad filed Sep. 6, 1996, now U.S. Pat. No. 6,083,768, assigned to the assignee of the present invention and hereby incorporated herein by reference.

Rather than gravitational forces causing the viscous material to flow and expand as when on top of the lead frame, the gravitational forces on the inverted lead frame maintain the shape and boundary definition of the viscous material.

It is, of course, understood, that the viscous material must be compatible with the lead finger material so as to adhere thereto and must not be of such a low viscosity that it drips when the lead fingers are removed from contact with the viscous material pool. Preferably, the viscous materials have viscosities between about 1000 cps and 500,000 cps.

Furthermore, with regard to drying or curing an adhesive material, the lead frame need only be inverted until the viscous adhesive material has stabilized sufficiently to maintain its shape and boundary definition. Depending on the particular viscous adhesive material used, the minimum inversion time could be the time required to cure the outer surfaces of the viscous adhesive material such that a film is formed which contains the as yet uncured viscous adhesive material therein, or the minimum inversion time could be the time required to completely dry or cure the viscous adhesive material.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
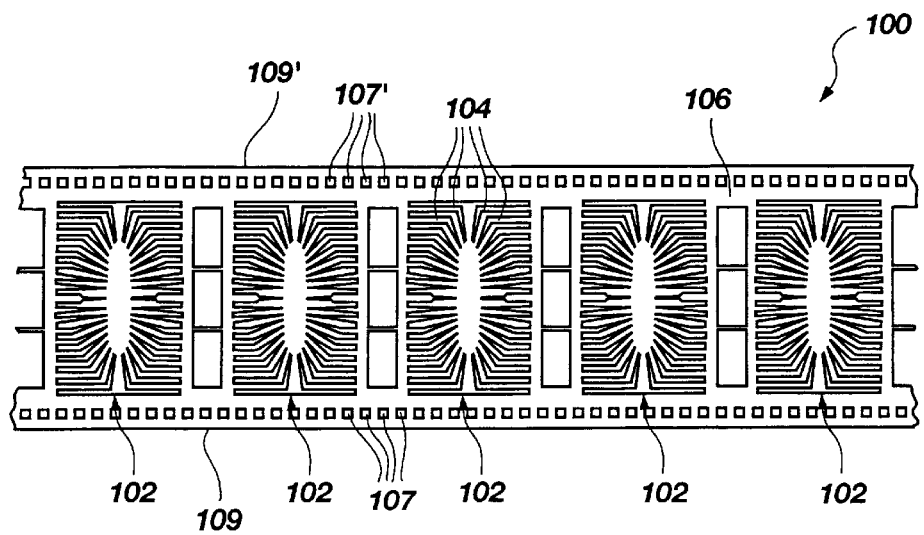
FIG. 1 is a top plan view of a typical lead frame strip.

FIG. 1 illustrates a portion of an exemplary lead frame strip 100. It should be understood that the figures presented in conjunction with this description are not meant to be actual views of any particular portion of an actual semiconducting device or component, but are merely idealized representations which are employed to more clearly and fully depict the process of the invention than would otherwise be possible. Individual lead frames 102, each including a plurality of lead fingers 104, are formed in a long, thin strip of conductive material 106, such as copper, copper alloy, or the like. The lead frames 102 are generally formed by a stamping process or an etching process. The lead frames 102 are formed side-by-side along the conductive material strip 106 wherein the conductive material strip 106 includes a plurality of indexing holes 107, 107' on opposing lengthwise edges 109, 109', respectively, of the conductive material strip 106. The indexing holes 107, 107' are used to move the lead frame strip 100 and align the lead frames 102 throughout a process of attaching the lead frames 102 to semiconductor dice (not shown).

Figure 2:
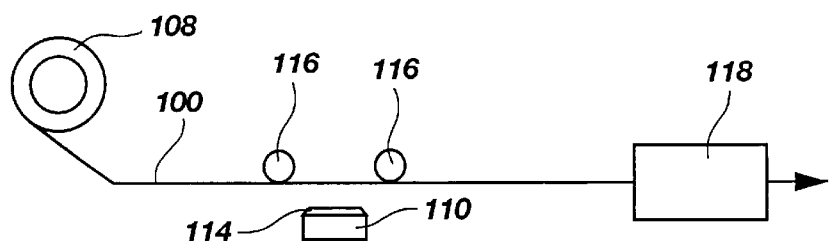
FIGS. 2 and 3 are schematic representations of one process of the present invention.
Figure 3:
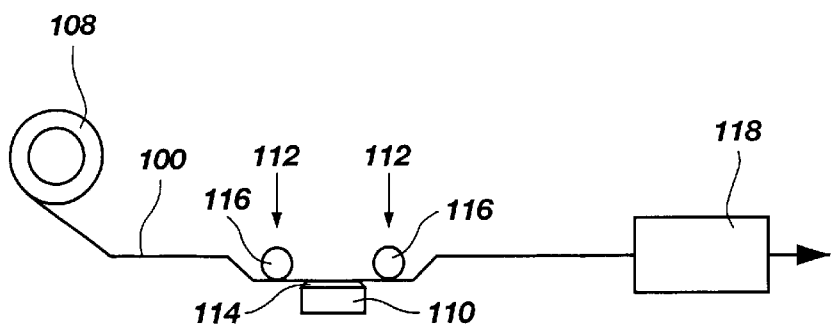

FIGS. 2 and 3 illustrate a schematic of one process of the present invention. Elements common to FIGS. 1, 2, and 3 retain the same numeric designation. The lead frame strip 100, such as illustrated in FIG. 1, is fed from a source 108, such as a spool, to an adhesive reservoir 110. As shown in FIG. 3, the lead fingers 104 (not shown) of the lead frame 102 (not shown) are aligned over the adhesive reservoir 110 and the lead frame strip 100 is biased downward in direction 112, such as by hydraulic, pneumatic, or electrically-powered biasing mechanisms 116, to contact an adhesive material 114. The adhesive material 114 may be any viscous adhesive material including but not limited to thermoplastics, thermoset resins, flowable pastes, and B-stage adhesive materials. Preferred adhesive materials 114 include cyanate ester, bismaleimide, epoxy, and polyimide.

Figure 4:
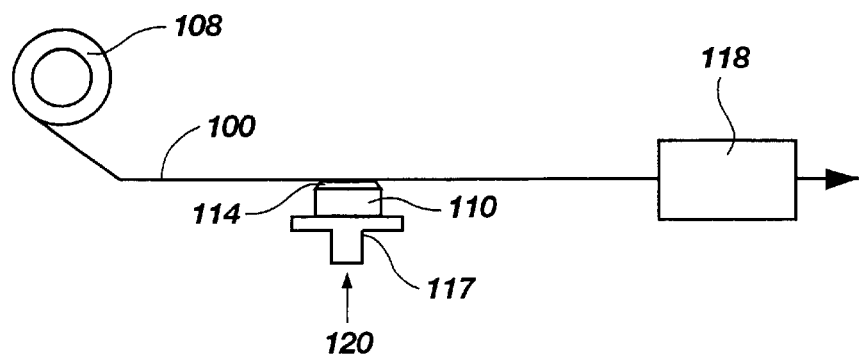
FIG. 4 is a schematic representation of an alternate process of the present invention.

FIG. 4 illustrates a schematic of another process of the present invention which is similar to the process of FIGS. 2 and 3. Elements common to FIGS. 2 and 3 and FIG. 4 retain the same numeric designation. The only difference between the processes of FIGS. 2 and 3, and FIG. 4 is that the process of FIG. 4 employs an elevator mechanism 117 to move the adhesive reservoir 110 in an upward direction 120 to contact the lead fingers 104 rather than biasing the lead frame strip 100 downward to the adhesive reservoir 110.

It is, of course, understood that the biasing and elevator mechanisms 116 and 117 shown in FIGS. 2–4 are not required to bring the adhesive material 114 into contact with the lead fingers 104. Instead, the lead fingers 104 may be brought into close proximity to the adhesive reservoir 110 and additional adhesive material 114 may be delivered by a pump to the adhesive reservoir 110 to raise the level of the adhesive material 114 to contact the lead fingers 104, or to provide a moving wave or surge of adhesive material traveling across the reservoir 110.

Figure 5:
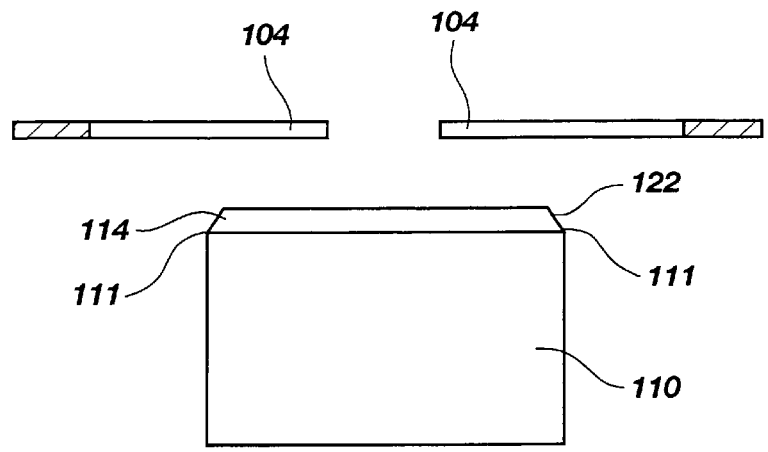
FIGS. 5–7 are side views of a process of contacting lead fingers with an adhesive material according to a method of the present invention.
Figure 6:
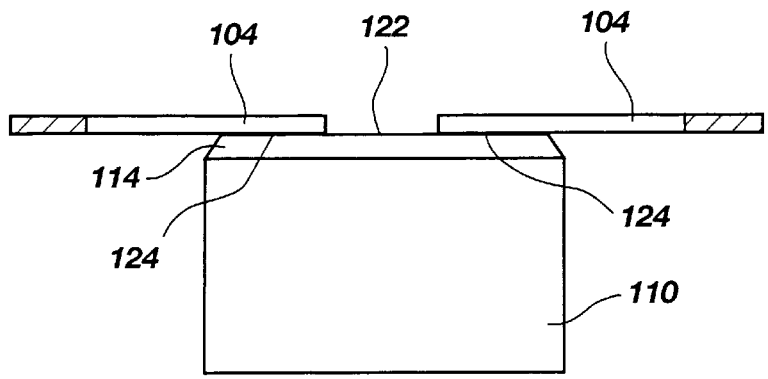
Figure 7:
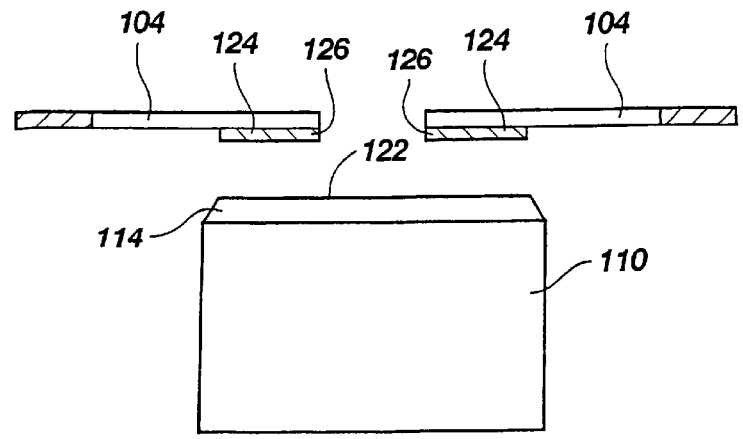

FIGS. 5–7 illustrate side views of the lead fingers 104 being brought into contact with the adhesive material 114 and being retracted therefrom. Elements common to FIGS. 2–4 and FIGS. 5–7 retain the same numeric designation. As shown in FIG. 5, the lead fingers 104 are positioned over the adhesive reservoir 110. The adhesive reservoir 110 has the adhesive material 114 extending above edges 111 of the adhesive reservoir 110. Due to the forces of adhesion and surface tension inherent in the adhesive material 114, an exposed surface 122 of the adhesive material 114 will form a meniscus, or convex-shaped configuration, above the reservoir edges 111.

As shown in FIG. 6, the lead fingers 104 are lowered onto or proximate the exposed surface 122 of the adhesive material 114. When a bottom surface 124 of the lead fingers 104 comes in contact with the exposed surface 122 of the adhesive material 114, the adhesive material 114 wets out across the bottom surface 124 of the lead finger 104. As shown in FIG. 7, when the lead fingers 104 are retracted from the adhesive material 114, the cohesion of the adhesive material 114 with the lead fingers 104 pulls some of the adhesive material 114 from the bulk of the adhesive material 114 to form an adhesive film 126 on the bottom surface 124 of the lead finger 104. The thickness of the adhesive film 126 can range from 0.1 to 15 mils depending on the viscosity of the adhesive material 114. Changing the shape of the lead finger 104, changing the rheology of the adhesive material 114, pre-coating the lead finger 104 with a surfactant, such as NMP, or placing a solvent in the adhesive material 114 to improve wetting, and/or adding adhesion promoters, such as silane, siloxane, or polyimide siloxane, to the adhesive material 114 will also change the thickness and/or pattern of the adhesive film 126. It is, of course, understood that the adhesive material 114 must be capable of adhering to the lead fingers 104 and must not be of such a low viscosity that it drips when the lead fingers 104 are removed from contact with the exposed surface 122 of the adhesive material 114.

Figure 8:
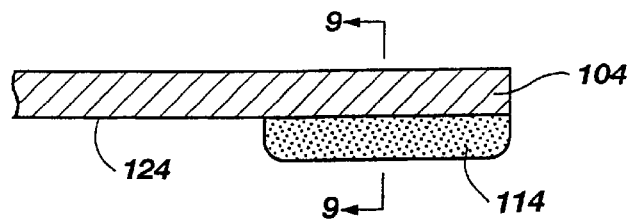
FIG. 8 is a side cross-sectional view of a lead finger after adhesive material attachment according to a method of the present invention.
Figure 9:
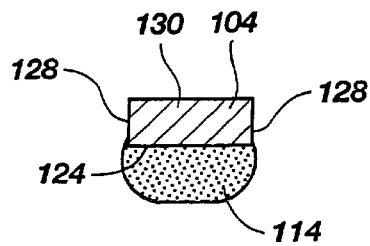
FIG. 9 is a cross-sectional view of a lead finger along line 9—9 of FIG. 8 after adhesive material attachment.

FIG. 8 is a side cross-sectional view of a lead finger 104 after adhesive material 114 application. FIG. 9 is a cross-sectional view of the lead finger 104 of FIG. 8 along line 9—9. As shown in FIGS. 8 and 9, by only contacting the bottom surface 124 of the lead finger 104 with the exposed surface 122 of the adhesive material 114, the adhesive material 114 will not wet sides 128 of the lead finger 104 and, of course, will not collect on a bond wire surface 130 of a lead finger 104 (the bond wire surface 130 is the lead finger surface where a bond wire is subsequently attached during further processing). Since the adhesive material 114 does not collect on the bond wire surface 130, there will be no adhesive material 114 to interfere with a subsequent wire bonding step subsequent to LOC attachment of the lead fingers 104 to an active surface of a semiconductor die.

Referring back to FIG. 5, the adhesive reservoir 110 can be shaped such that the exposed surface 122 of the adhesive material 114 is in a precise location. When the lead fingers 104 contact the exposed surface 122 of the adhesive material 114, the adhesive material 114 attaches to only specific, desired portions of the lead fingers 104.

Figure 10:
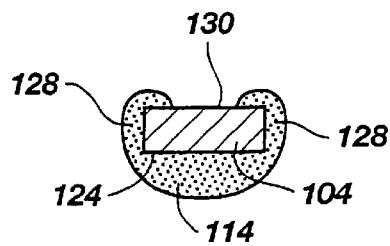
FIG. 10 is a cross-sectional view of a lead finger after adhesive material attachment, wherein the adhesive material exhibits excessive wetting of the lead finger.

It is very important that the exposed surface 122 be as level as possible. If the exposed surface 122 is not level, the lead fingers 104 may extend too deeply into the adhesive material 114. When this occurs, the adhesive material 114 may wet the lead finger sides 128 and may even wet the lead finger bond wire surface 130, as shown in FIG. 10. If the adhesive material 114 wets the bond wire surface 130, the adhesive material 114 may interfere with a subsequent wire bonding step subsequent to LOC attachment of the lead fingers 104 to an active surface of a semiconductor die, as mentioned above.

Figure 11:
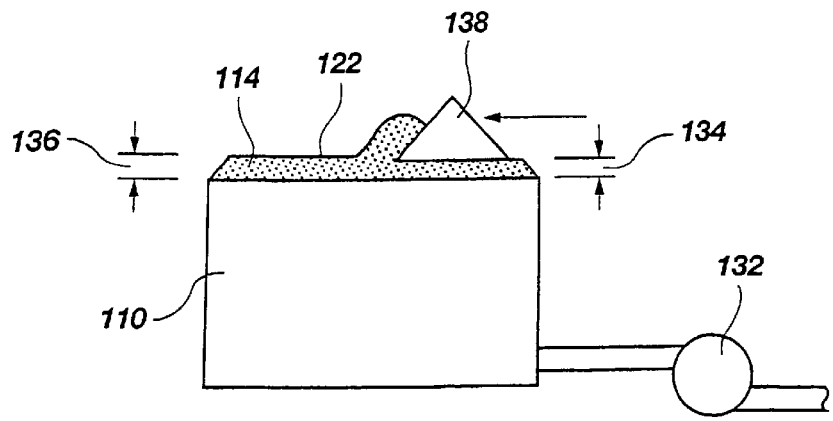
FIG. 11 is a schematic representation of a mechanical mechanism for maintaining the height of an exposed surface of an adhesive material.

Numerous techniques may be used to keep the exposed surface 122 of the adhesive material 114 level. It is, of course, understood that exposed surface 122 extends from the adhesive reservoir 110 due to a slight excess of adhesive material 114 within the adhesive reservoir 110. As shown in FIG. 11, the adhesive material 114 is pumped to the adhesive reservoir 110 from an adhesive material source (not shown) by a pump 132. A desired exposed surface height 134 of exposed surface 122 can be achieved by feeding an excess of adhesive material 114 into the adhesive reservoir 110 such that an initial exposed surface height 136 is higher than the desired exposed surface height 134. A metering mechanism, such as wiper 138, can be utilized to meter the adhesive material 114 from the initial exposed surface height 136 to the desired exposed surface height 134.

Moreover, a desired exposed surface height 134 of exposed surface 122 can be achieved by feeding an excess of adhesive material 114 into the adhesive reservoir 110 such that an initial exposed surface height 136 is higher than the desired exposed surface height 134. The adhesive material 114 is then drawn back (e.g., by vacuum), which results in a flattening of the exposed surface 122.

Figure 12:
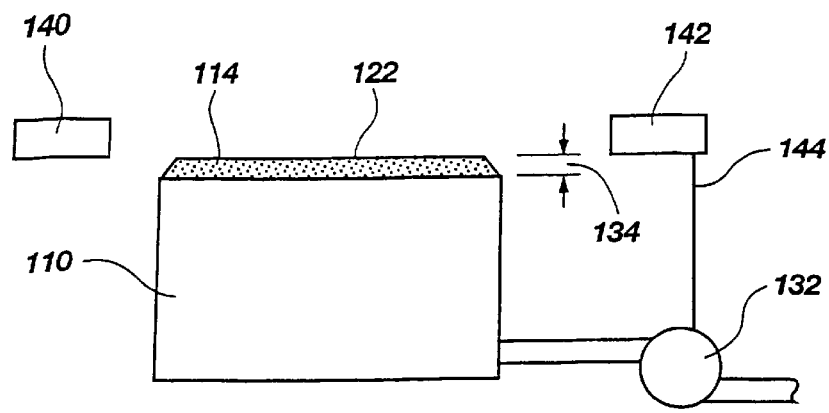
FIG. 12 is a schematic representation of a height detection and control loop for maintaining the height of an exposed surface of an adhesive material.

Furthermore, a variety of feed back and feed forward control schemes may be used to control the desired exposed surface height 134 of the exposed surface 122. One such control scheme is shown in FIG. 12. Elements common to FIG. 11 and FIG. 12 retain the same numeric designations. A height detection mechanism, shown as a transmitter 140 and a receiver 142, is used to determine the height of the exposed surface 122. A control signal 144 triggers the pump 132 to stop or a valve (not shown) to shut when the desired exposed surface height 134 is achieved. The transmitter 140 and receiver 142 may be a light (preferably a laser) transmitter and receiver. When a light beam (not shown) from the transmitter 140 is altered by the exposed surface 122, the receiver 142 detects the discontinuation of light transmission and generates the control signal 144. Additionally, the transmitter 140 and receiver 142 may be an ultrasonic transmitter and receiver. When an ultrasonic sound wave (not shown) from the transmitter 140 is altered by the exposed surface 122, the receiver 142 detects the change in transit time or phase shifts of the ultrasonic sound wave and generates the control signal 144.

It is, of course, understood that precise control of the lead frame position relative to the exposed surface 122 is required to accurately control the depth to which the lead fingers 104 are pressed into the adhesive material 114.

Figure 13:
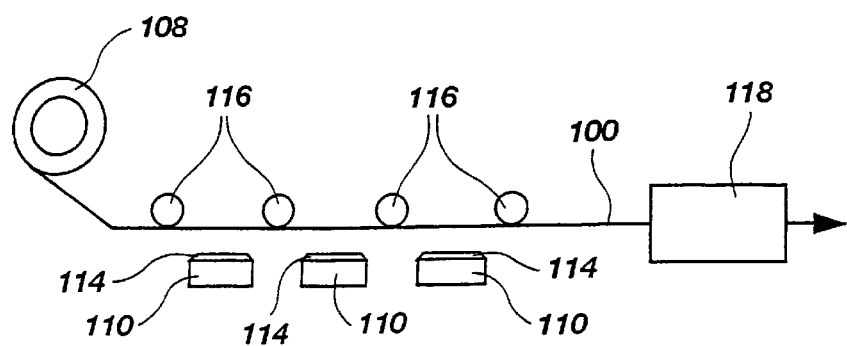
FIG. 13 is a schematic representation of another multiple adhesive material attachment process of the present invention.
Figure 14:
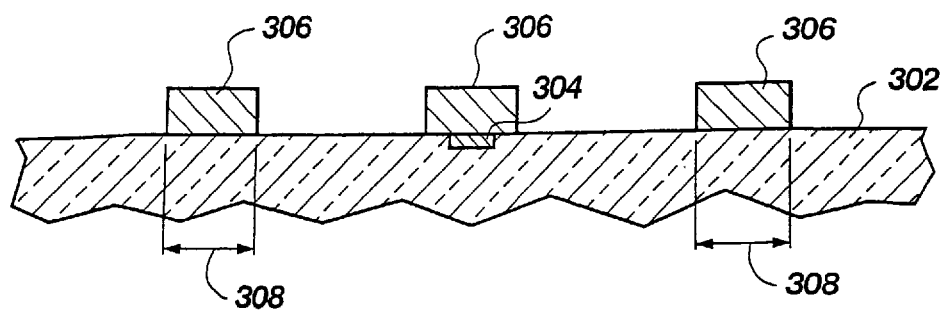
FIGS. 14–20 are side cross-sectional views of a prior art technique of forming adhesive areas on a substrate for LOC attachment.
Figure 15:
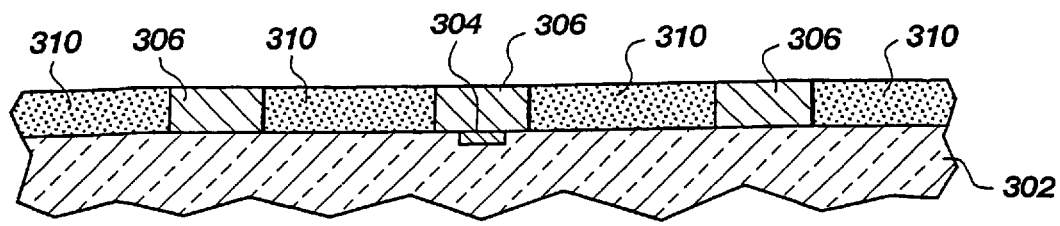
Figure 16:
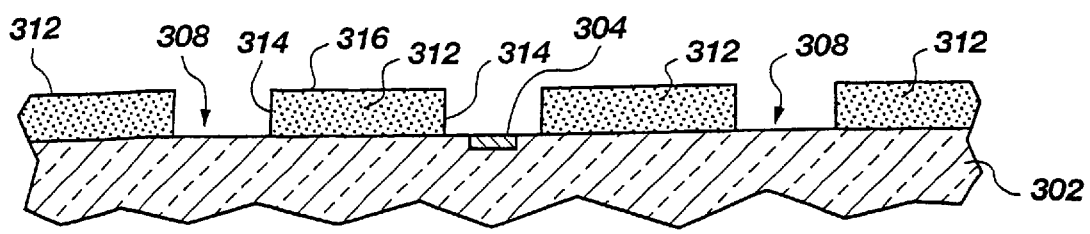
Figure 17:
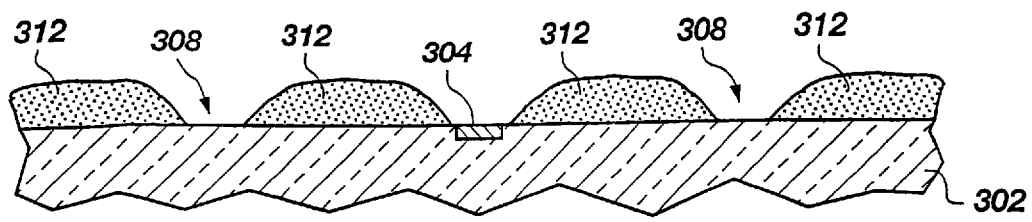
Figure 18:
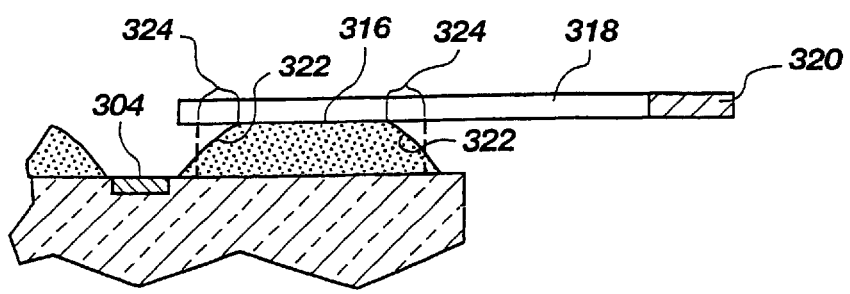
Figure 19:
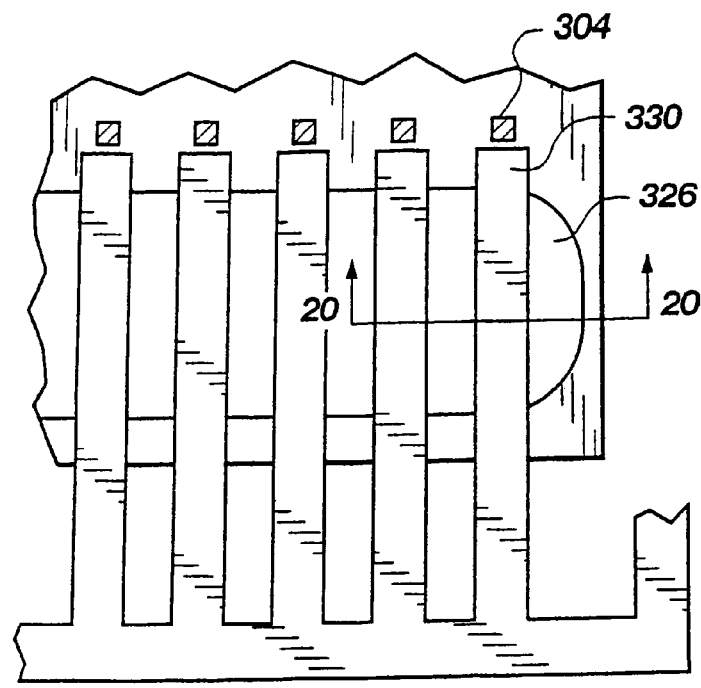
Figure 20:
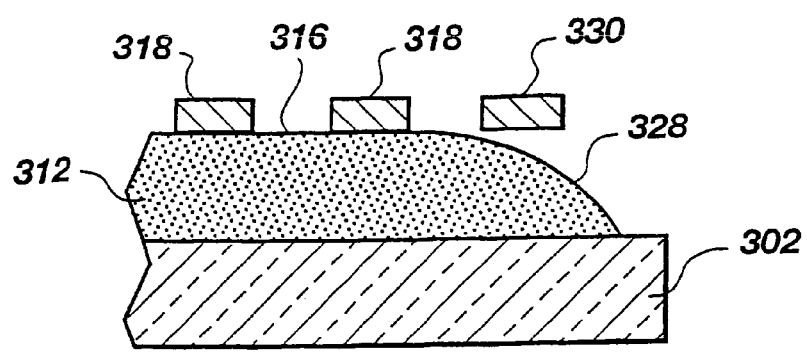
Figure 21:
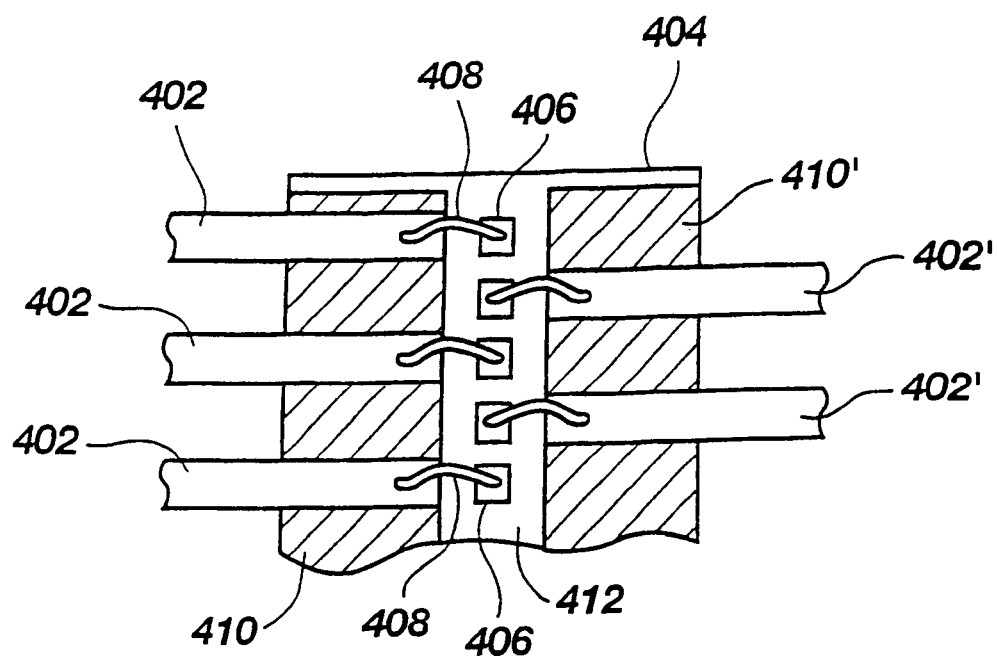
FIG. 21 is a top view of a prior art technique of LOC attachment using adhesive tape.
Figure 22:
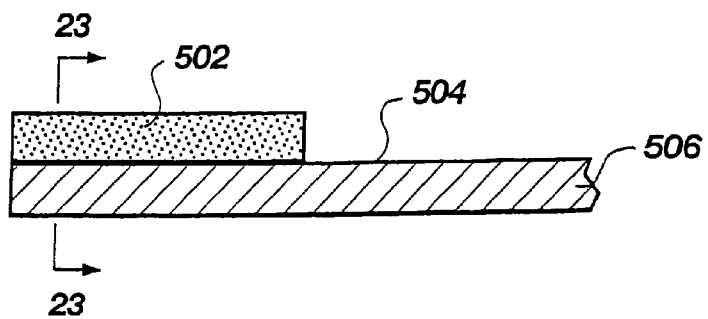
FIGS. 22–24 are side cross-sectional views of a prior art technique of forming adhesive areas on lead fingers for LOC attachment.
Figure 23:
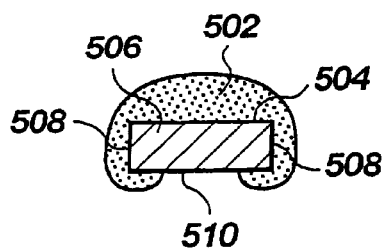
Figure 24:
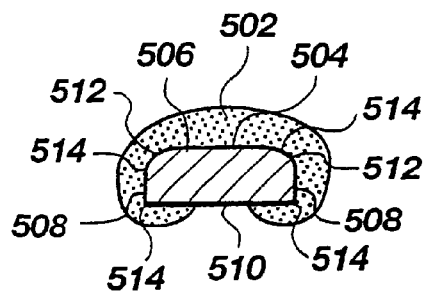

It is also understood that multiple reservoirs 110 could be configured as shown in FIG. 13. With such a configuration, the adhesive material 114 can be applied to the lead fingers 104 of multiple lead frames 102 simultaneously. The group of lead frames 102 is then indexed forward and another group is presented to the multiple reservoirs 110 for coating.

Once the adhesive material 114 has been applied to the lead fingers 104, the lead frame strip 100 may, optionally, be fed to a curing oven 118, shown in FIGS. 2, 3, 4, and 13, to set the adhesive material 114. A semiconductor die (not shown) then can be attached to a lead frame 102 and adhesive film 126 by known LOC attach methods.

It is, of course, understood that the present invention is not limited to the above detailed description. The structures coated are not limited to lead frames and can include TAB structures and the like. The lead frames may not be limited to delivery in strips, but can be delivered individually or in sheets. The viscous material can be applied to a structure under at least a partially-evacuated chamber such that lower-viscosity materials could be used and still form a meniscus wherein the viscous material applied to the structure would be at least partially dried or cured prior to removal from the chamber.

Furthermore, the present invention is not limited to only applying a viscous material to lead fingers, but it is also contemplated that the viscous material may be applied to bus bars, die attach paddles, or other structures of a lead frame, as well as dipping any semiconductor component which requires a coating of a viscous material. Additionally, the viscous material is not limited to adhesives, but may include various viscous materials for a variety of applications. One such application includes applying a polyimide film to a lead frame in order to eliminate the need for Kapton™ tape.

Figure 25:
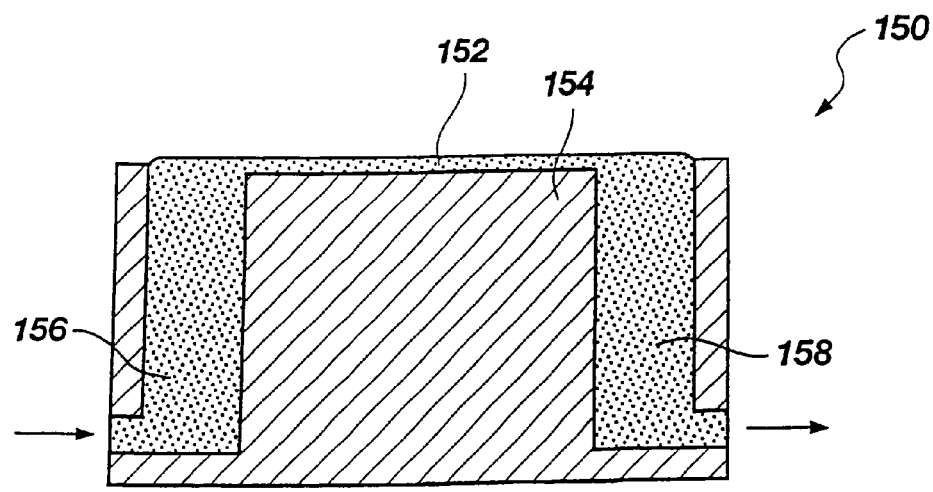
FIG. 25 is a plate-type reservoir design according to the present invention.
Figure 26:
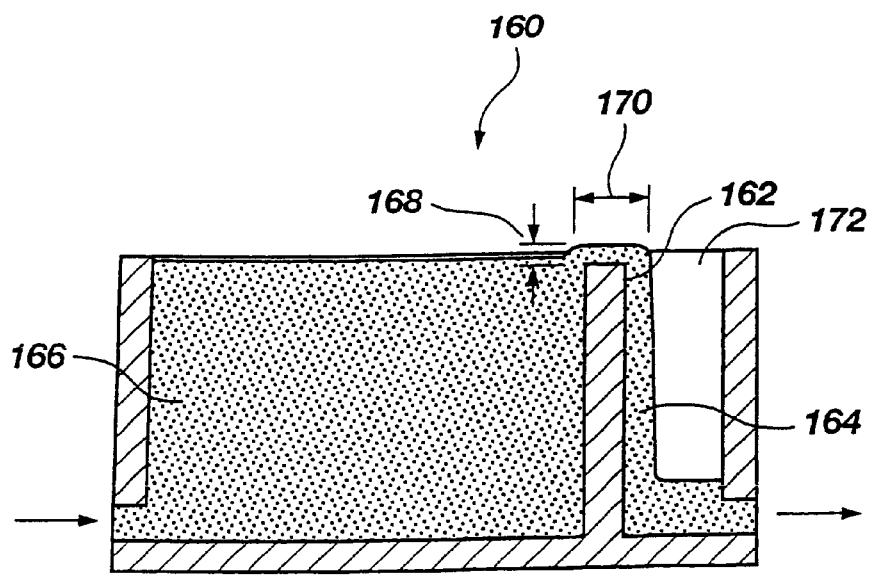
FIG. 26 is a spillway-type reservoir design according to the present invention.

Moreover, the reservoir may be any structure which exposes a viscous material pool and may be one of a variety of designs, as shown in FIGS. 25–26. FIG. 25 illustrates a plate-type reservoir 150 in which a very thin layer of viscous material 152 is delivered across plate 154 from an inlet 156 to an opposing outlet 158. FIG. 26 illustrates a reservoir 160 with a curved-edge spillway 162. The viscous material 164 is pumped into a chamber 166 and over the spillway 162 at a constant rate. This results in a self-limiting viscous material height 168. The lead fingers of a lead frame are contacted with the viscous material 164 over the spillway 162 where the viscous material 164 would inherently, due to its viscosity, form a raised area 170 over the spillway 162 into a spill chamber 172.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. An apparatus for applying flowable adhesive material to a selected portion of a surface of a lead frame to be attached to a semiconductor die, comprising:

at least one flowable adhesive material reservoir comprising a housing having a pool chamber, the pool chamber having an upward facing opening defined by a peripheral edge, said at least one flowable adhesive material reservoir further comprising a means for maintaining, across at least a substantial portion of the upward facing opening of the pool chamber, a substantially level exposed surface of a flowable adhesive material to be disposed therein; and at least one mechanism configured for positioning a selected portion of a surface of a lead frame over the upward facing opening at a preselected height above the peripheral edge of the at least one flowable adhesive material reservoir.

2. The apparatus of claim 1, wherein the at least one mechanism configured for positioning a selected portion of a surface of a lead frame is configured to position at least one lead finger of the lead frame over the upward facing opening at a preselected height above the peripheral edge of the pool chamber.

3. The apparatus of claim 1, wherein the at least one mechanism configured for positioning a selected portion of a surface of a lead frame is configured to position a selected surface of at least one lead finger of the lead frame over the upward facing opening at a preselected height above the peripheral edge of the pool chamber.

4. The apparatus of claim 1, wherein said means for maintaining a substantially level exposed surface of a flowable adhesive material comprises a pump for supplying flowable adhesive material to the pool chamber of the at least one flowable adhesive material reservoir from a source of flowable adhesive material.

5. The apparatus of claim 4, further comprising:

a control system for controlling a height to which a flowable adhesive material is allowed to extend above the upward facing opening of the pool chamber of the at least one flowable adhesive material reservoir.

6. The apparatus of claim 5, wherein the control system comprises a transmitter and a receiver positioned above the flowable adhesive material reservoir.

7. The apparatus of claim 6, wherein the transmitter is adapted to transmit light waves and the receiver is adapted to receive light waves.

8. The apparatus of claim 7, wherein the transmitter is a laser.

9. The apparatus of claim 6, wherein the transmitter is adapted to transmit sound waves and the receiver is adapted to receive sound waves.

10. The apparatus of claim 9, wherein the transmitter is adapted to transmit ultrasonic sound waves and the receiver is adapted to receive ultrasonic sound waves.

11. The apparatus of claim 1, wherein said means for maintaining a substantially level exposed surface of a flowable adhesive material comprises a metering mechanism proximate to the at least one flowable adhesive material reservoir comprising a moveable wiper drawable across the upward facing opening of the pool chamber at a preselected height therefrom.

12. The apparatus of claim 1, wherein the at least one flowable adhesive material reservoir comprises a plurality of flowable adhesive material reservoirs and the at least one mechanism configured for positioning a selected portion of a surface of a lead frame comprises a plurality of mechanisms configured for positioning a selected portion of a surface of a lead frame.

13. The apparatus of claim 1, wherein said means for maintaining a substantially level exposed surface of a flowable adhesive material comprises a vacuum source for drawing down flowable adhesive material which has been allowed to extend above the peripheral edge of the pool chamber of the at least one flowable adhesive material reservoir.

14. The apparatus of claim 1, wherein the at least one flowable adhesive material reservoir further comprises a plate extending generally horizontally across at least a portion of the pool chamber proximate the upwardly facing opening of the pool chamber, the plate being positioned a preselected vertical distance below the peripheral edge of the pool chamber.

15. The apparatus of claim 14, wherein the at least one flowable adhesive material reservoir further comprises an inlet for introducing flowable adhesive material into the pool chamber and an outlet for removing flowable adhesive material from the pool chamber.

16. The apparatus of claim 1, wherein the at least one flowable adhesive material reservoir further comprises:

the pool chamber having a spillway structure subdividing the pool chamber into a first chamber and a spill chamber, the spillway structure having an uppermost portion positioned proximate the upwardly facing open portion and located a preselected distance from the peripheral edge of the pool chamber; and a pump for supplying flowable adhesive material to the first chamber.

17. The apparatus of claim 16, further comprising an inlet for introducing flowable adhesive material supplied by the pump into the first chamber and an outlet for removing flowable adhesive material from the spill chamber.

18. The apparatus of claim 16, further comprising the at least one mechanism positioning the selected portion of the surface of the lead frame generally over the upper most portion of the spillway structure.

19. An apparatus for applying flowable material to a selected portion of a surface of a lead frame to be attached to a semiconductor die comprising:

at least one flowable material reservoir comprising a housing having a pool chamber, the pool chamber having an upward facing opening defined by a peripheral edge, and at least one mechanism for maintaining, across at least a substantial portion of the upward facing opening of the pool chamber, a substantially level exposed surface of a flowable material to be disposed therein; and at least one mechanism configured for positioning a selected portion of a surface of a lead frame over the upward facing opening to a preselected height above the peripheral edge of the pool chamber.

20. The apparatus of claim 19, wherein the at least one mechanism configured for positioning a selected portion of a surface of a lead frame is configured to position at least one lead finger of the lead frame over the upward facing opening at a preselected height above the peripheral edge of the pool chamber.

21. The apparatus of claim 19, wherein the at least one mechanism configured for positioning a selected portion of a surface of a lead frame is configured to position a selected surface of at least one lead finger of the lead frame over the upward facing opening at a preselected height above the peripheral edge of the pool chamber.

22. The apparatus of claim 19, wherein said at least one mechanism for maintaining a substantially level exposed surface of a flowable material comprises a pump for supplying flowable material to the pool chamber of the at least one flowable material reservoir from a source of flowable material.

23. The apparatus of claim 22, further comprising a control system for controlling a height to which a flowable material is allowed to extend above the upward facing opening of the pool chamber of the at least one flowable material reservoir.

24. The apparatus of claim 23, wherein the control system comprises a transmitter and a receiver positioned above the at least one flowable material reservoir.

25. The apparatus of claim 24, wherein the transmitter is adapted to transmit light waves and the receiver is adapted to receive light waves.

26. The apparatus of claim 25, wherein the transmitter is a laser.

27. The apparatus of claim 24, wherein the transmitter is adapted to transmit sound waves and the receiver is adapted to receive sound waves.

28. The apparatus of claim 27, wherein the transmitter is adapted to transmit ultrasonic sound waves and the receiver is adapted to receive ultrasonic sound waves.

29. The apparatus of claim 19, wherein said at least one mechanism for maintaining a substantially level exposed surface of a flowable material comprises a metering mechanism proximate to the at least one flowable material reservoir comprising a moveable wiper drawable across the upward facing opening of the pool chamber at a preselected height thereabove.

30. The apparatus of claim 19, wherein the at least one flowable material reservoir comprises a plurality of flowable material reservoirs and the at least one mechanism configured for positioning a selected portion of a surface of a lead frame comprises a plurality of mechanisms configured for positioning a selected portion of a surface of a lead frame.

31. The apparatus of claim 19, wherein said at least one mechanism for maintaining a substantially level exposed surface of a flowable material comprises a vacuum source for drawing down flowable material which has been allowed to extend above the peripheral edge of the pool chamber of the at least one flowable material reservoir.

32. The apparatus of claim 31, wherein the at least one flowable material reservoir further comprises an inlet for introducing flowable material into the pool chamber and an outlet for removing flowable material from the pool chamber.

33. The apparatus of claim 19, wherein the at least one flowable material reservoir further comprises a plate extending generally horizontally across at least a portion of the pool chamber proximate the upwardly facing opening of the pool chamber, the plate being positioned a preselected vertical distance below the peripheral edge of the pool chamber.

34. The apparatus of claim 19, wherein the at least one flowable material reservoir further comprises:
the pool chamber having a spillway structure subdividing the pool chamber into a first chamber and a spill chamber, the spillway structure having an uppermost portion positioned proximate the upwardly facing open portion and located a preselected distance from the peripheral edge of the pool chamber; and
a pump for supplying flowable material to the first chamber.

35. The apparatus of claim 34, further comprising an inlet for flowing material supplied by the pump into the first chamber and an outlet for flowing material out of the spill chamber.

36. The apparatus of claim 34, further comprising the at least one mechanism configured to position the selected portion of the surface of the lead frame generally over the upper most portion of the spillway structure.

37. An apparatus for applying flowable material to a selected portion of a surface of a semiconductor component comprising:
at least one flowable material reservoir comprising a housing having a pool chamber, the pool chamber having an upward facing opening defined by a peripheral edge, said at least one flowable adhesive material reservoir further comprising a means for maintaining, across at least a substantial portion of the upward facing opening of the pool chamber, a substantially level exposed surface of a flowable material to be disposed therein; and
at least one mechanism configured for positioning a selected portion of a surface of a semiconductor component over the upward facing opening to a preselected height above the peripheral edge of the pool chamber.

38. The apparatus of claim 37, wherein the at least one mechanism configured for positioning a selected portion of a surface of a semiconductor component is configured to position at least one lead finger of the semiconductor component over the upward facing opening at a preselected height above the peripheral edge of the pool chamber.

39. The apparatus of claim 37, wherein the at least one mechanism configured for positioning a selected portion of a surface of a semiconductor component is configured to position a selected surface of at least one lead finger of the semiconductor component over the upward facing opening at a preselected height above the peripheral edge of the pool chamber.

40. The apparatus of claim 37, wherein said means for maintaining a substantially level exposed surface of a flowable material comprises a pump for supplying flowable material to the pool chamber of the at least one flowable material reservoir from a source of flowable material.

41. The apparatus of claim 40, further comprising a control system for controlling a height to which a flowable material is allowed to extend above the upward facing opening of the pool chamber of the at least one flowable material reservoir.

42. The apparatus of claim 41, wherein the control system comprises a transmitter and a receiver positioned above the at least one flowable material reservoir.

43. The apparatus of claim 42, wherein the transmitter is adapted to transmit light waves and the receiver is adapted to receive light waves.

44. The apparatus of claim 43, wherein the transmitter is a laser.

45. The apparatus of claim 42, wherein the transmitter is adapted to transmit sound waves and the receiver is adapted to receive sound waves.

46. The apparatus of claim 45, wherein the transmitter is adapted to transmit ultrasonic sound waves and the receiver is adapted to receive ultrasonic sound waves.

47. The apparatus of claim 37, wherein said means for maintaining a substantially level exposed surface of a flowable material comprises a metering mechanism proximate to the at least one flowable material reservoir comprising a moveable wiper drawable across the upward facing opening of the pool chamber at a preselected height thereabove.

48. The apparatus of claim 37, wherein the at least one flowable material reservoir comprises a plurality of flowable material reservoirs and the at least one mechanism for positioning a selected portion of a surface of a semiconductor component comprises a plurality of mechanisms for positioning a selected portion of a surface of a semiconductor component.

49. The apparatus of claim 37, wherein said means for maintaining a substantially level exposed surface of a flowable material comprises a vacuum source for drawing down adhesive material which has been allowed to extend above the peripheral edge of the pool chamber of the at least one flowable material reservoir.

50. The apparatus of claim 49, wherein the at least one flowable material reservoir further comprises an inlet for introducing flowable material into the pool chamber and an outlet for removing flowable material from the pool chamber.

51. The apparatus of claim 37, wherein the at least one flowable material reservoir further comprises a plate extending generally horizontally across at least a portion of the pool chamber proximate the upwardly facing opening of the pool chamber, the plate being positioned a preselected vertical distance below the peripheral edge of the pool chamber.

52. The apparatus of claim 37, wherein the at least one flowable material reservoir further comprises:
the pool chamber having a spillway structure subdividing the pool chamber into a first chamber and a spill chamber, the spillway structure having an uppermost portion positioned proximate the upwardly facing open portion and located a preselected distance from the peripheral edge of the pool chamber; and
a pump for supplying flowable material to the first chamber.

53. The apparatus of claim 52, further comprising an inlet for introducing flowable material supplied by the pump into the first chamber and an outlet for removing material from the spill chamber.

54. The apparatus of claim 52, further comprising the at least one mechanism configured to position the selected portion of the surface of the semiconductor component generally over the upper most portion of the spillway structure.

55. An apparatus for applying flowable adhesive material to a selected portion of a lead frame to be attached to a semiconductor die, comprising:

at least one flowable adhesive reservoir comprising a housing having a pool chamber, the pool chamber having an upward facing opening defined by a peripheral edge;

at least one mechanism configured for positioning a selected portion of a lead frame over the upward facing opening at a preselected height above the peripheral edge of the pool chamber;

a pump for supplying flowable adhesive material to the pool chamber of the at least one adhesive material reservoir from a source of flowable adhesive material; and a control system comprising a transmitter and a receiver positioned above the flowable adhesive material reservoir for controlling a height to which a flowable adhesive material is allowed to extend above the upward facing opening of the pool chamber of the at least one flowable adhesive material reservoir.

56. The apparatus of claim 55, wherein the at least one mechanism configured for positioning a selected portion of a lead frame is configured to position at least one lead finger of the lead frame over the upward facing opening at a preselected height above the peripheral edge of the pool chamber.

57. The apparatus of claim 55, wherein the at least one mechanism configured for positioning a selected portion of a lead frame is configured to position a selected surface of at least one lead finger of the lead frame over the upward facing opening at a preselected height above the peripheral edge of the pool chamber.

58. The apparatus of claim 55, wherein the transmitter is adapted to transmit light waves and the receiver is adapted to receive light waves.

59. The apparatus of claim 58, wherein the transmitter is a laser.

60. The apparatus of claim 55, wherein the transmitter is adapted to transmit sound waves and the receiver is adapted to receive sound waves.

61. The apparatus of claim 60, wherein the transmitter is adapted to transmit ultrasonic sound waves and the receiver is adapted to receive ultrasonic sound waves.

62. The apparatus of claim 55, wherein the at least one flowable adhesive material reservoir comprises a plurality of flowable adhesive material reservoirs and the at least one mechanism configured for positioning a preselected portion of a lead frame comprises a plurality of mechanisms configured for positioning a selected portion of a lead frame.

63. The apparatus of claim 55, further comprising a vacuum source for drawing down flowable adhesive material which has been allowed to extend above the peripheral edge of the pool chamber of the at least one flowable adhesive material reservoir.

64. The apparatus of claim 55, wherein the at least one flowable adhesive material reservoir further comprises a plate extending generally horizontally across at least a portion of the pool chamber proximate the upwardly facing opening of the pool chamber, the plate being positioned a preselected vertical distance below the peripheral edge of the pool chamber.

65. The apparatus of claim 64, wherein the at least one flowable adhesive material reservoir further comprises an inlet for introducing flowable adhesive material into the pool chamber and an outlet for removing flowable adhesive material from the pool chamber.

66. The apparatus of claim 55, wherein the at least one flowable adhesive material reservoir further comprises:

the pool chamber having a spillway structure subdividing the pool chamber into a first chamber and a spill chamber, the spillway structure having an uppermost portion positioned proximate the upwardly facing open portion and located a preselected distance from the peripheral edge of the pool chamber; and a pump for supplying flowable adhesive material to the first chamber.

67. The apparatus of claim 66, further comprising an inlet for introducing flowable adhesive material supplied by the pump into the first chamber and an outlet for removing flowable adhesive material from the spill chamber.

68. The apparatus of claim 66, further comprising the at least one mechanism positioning the selected portion of the lead frame generally over the upper most portion of the spillway structure.

69. An apparatus for applying flowable adhesive material to a selected portion of a lead frame to be attached to a semiconductor die, comprising:

at least one flowable adhesive reservoir comprising a housing having a pool chamber, the pool chamber having an upward facing opening defined by a peripheral edge;

at least one mechanism configured for positioning a selected portion of a lead frame over the upward facing opening at a preselected height above the peripheral edge of the pool chamber; and a metering mechanism proximate to the at least one flowable adhesive material reservoir comprising a moveable wiper drawable across the upward facing opening of the pool chamber at a preselected height therefrom.

70. An apparatus for applying flowable material to a selected portion of a lead frame to be attached to a semiconductor die, comprising:

at least one flowable material reservoir comprising a housing having a pool chamber, the pool chamber having an upward facing opening defined by a peripheral edge;

at least one mechanism configured for positioning a selected portion of a lead frame over the upward facing opening at a preselected height above the peripheral edge of the pool chamber; and a pump for supplying flowable material to the pool chamber of the at least one flowable material reservoir from a source of flowable material; and a control system comprising a transmitter and a receiver positioned above the flowable material reservoir for controlling a height to which a flowable material is allowed to extend above the upward facing opening of the pool chamber of the at least one flowable material reservoir.

71. The apparatus of claim 70, wherein the at least one mechanism configured for positioning a selected portion of a lead frame is configured to position at least one lead finger of the lead frame over the upward facing opening at a preselected height above the peripheral edge of the pool chamber.

72. The apparatus of claim 70, wherein the at least one mechanism configured for positioning a selected portion of a lead frame is configured to position a selected surface of at least one lead finger of the lead frame over the upward facing opening at a preselected height above the peripheral edge of the pool chamber.

73. The apparatus of claim 70, wherein the transmitter is adapted to transmit light waves and the receiver is adapted to receive light waves.

74. The apparatus of claim 73, wherein the transmitter is a laser.

75. The apparatus of claim 70, wherein the transmitter is adapted to transmit sound waves and the receiver is adapted to receive sound waves.

76. The apparatus of claim 75, wherein the transmitter is adapted to transmit ultrasonic sound waves and the receiver is adapted to receive ultrasonic sound waves.

77. The apparatus of claim 70, wherein the at least one flowable material reservoir comprises a plurality of flowable material reservoirs and the at least one mechanism configured for positioning a preselected portion of a lead frame comprises a plurality of mechanisms configured for positioning a selected portion of a lead frame.

78. The apparatus of claim 70, further comprising a vacuum source for drawing down flowable material which has been allowed to extend above the peripheral edge of the pool chamber of the at least one flowable material reservoir.

79. The apparatus of claim 70, wherein the at least one flowable material reservoir further comprises a plate extending generally horizontally across at least a portion of the pool chamber proximate the upwardly facing opening of the pool chamber, the plate being positioned a preselected vertical distance below the peripheral edge of the pool chamber.

80. The apparatus of claim 79, wherein the at least one flowable material reservoir further comprises an inlet for introducing flowable material into the pool chamber and an outlet for removing flowable material from the pool chamber.

81. The apparatus of claim 70, wherein the at least one flowable material reservoir further comprises the pool chamber including a spillway structure and a spill chamber, the spillway structure having an uppermost portion positioned proximate the upwardly facing open portion and located a preselected distance from the peripheral edge of the pool chamber.

82. The apparatus of claim 81, further comprising an inlet for flowing material supplied by the pump into the pool chamber and an outlet for flowing material out of the spill chamber.

83. The apparatus of claim 81, further comprising the at least one mechanism configured to position the selected portion of the lead frame generally over the upper most portion of the spillway structure.

84. An apparatus for applying flowable material to a selected portion of a lead frame to be attached to a semiconductor die, comprising:

at least one flowable material reservoir comprising a housing having a pool chamber, the pool chamber having an upward facing opening defined by a peripheral edge;

at lease one mechanism configured for positioning a selected portion of a lead frame over the upward facing opening at a preselected height above the peripheral edge of the pool chamber; and a metering mechanism proximate to the at least one flowable material reservoir comprising a moveable wiper drawable across the upward facing opening of the pool chamber at a preselected height therefrom.

85. An apparatus for applying flowable material to a selected portion of a semiconductor component, comprising:

at least one flowable material reservoir comprising a housing having a pool chamber, the pool chamber having an upward facing opening defined by a peripheral edge;

at least one mechanism configured for positioning a selected portion of a semiconductor component over the upward facing opening at a preselected height above the peripheral edge of the pool chamber; and a pump for supplying flowable material to the pool chamber of the at least one material reservoir from a source of flowable material; and a control system comprising a transmitter and a receiver positioned above the flowable material reservoir for controlling a height to which a flowable material is allowed to extend above the upward facing opening of the pool chamber of the at least one flowable material reservoir.

86. The apparatus of claim 85, wherein the at least one mechanism configured for positioning a selected portion of a semiconductor component is configured to position at least one leadfinger of the semiconductor component over the upward facing opening at a preselected height above the peripheral edge of the pool chamber.

87. The apparatus of claim 85, wherein the at least one mechanism configured for positioning a selected portion of a semiconductor component is configured to position a selected surface of at least one lead finger of the semiconductor component over the upward facing opening at a preselected height above the peripheral edge of the pool chamber.

88. The apparatus of claim 85, wherein the transmitter is adapted to transmit light waves and the receiver is adapted to receive light waves.

89. The apparatus of claim 88, wherein the transmitter is a laser.

90. The apparatus of claim 85, wherein the transmitter is adapted to transmit sound waves and the receiver is adapted to receive sound waves.

91. The apparatus of claim 90, wherein the transmitter is adapted to transmit ultrasonic sound waves and the receiver is adapted to receive ultrasonic sound waves.

92. The apparatus of claim 85, wherein the at least one flowable material reservoir comprises a plurality of flowable material reservoirs and the at least one mechanism for positioning a preselected portion of a semiconductor component comprises a plurality of mechanisms for positioning a selected portion of a semiconductor component.

93. The apparatus of claim 85, further comprising a vacuum source for drawing down flowable material which has been allowed to extend above the peripheral edge of the pool chamber of the at least one flowable material reservoir.

94. The apparatus of claim 93, wherein the at least one flowable material reservoir further comprises an inlet for introducing flowable material into the pool chamber and an outlet for removing flowable material from the pool chamber.

95. The apparatus of claim 85, wherein the at least one flowable material reservoir further comprises a plate extending generally horizontally across at least a portion of the pool chamber proximate the upwardly facing opening of the pool chamber, the plate being positioned a preselected vertical distance below the peripheral edge of the pool chamber.

96. The apparatus of claim 85, wherein the at least one flowable material reservoir further comprises the pool chamber including a spillway structure and a spill chamber, the spillway structure having an uppermost portion positioned proximate the upwardly facing open portion and located a preselected distance from the peripheral edge of the pool chamber.

97. The apparatus of claim 96, further comprising an inlet for introducing flowable material supplied by the pump into the pool chamber and an outlet for removing material from the spill chamber.

98. The apparatus of claim 96, further comprising the at least one mechanism configured to position the selected portion of the semiconductor component generally over the upper most portion of the spillway structure.

99. An apparatus for applying flowable material to a selected portion of a semiconductor component, comprising:

at least one flowable material reservoir comprising a housing having a pool chamber, the pool chamber having an upward facing opening defined by a peripheral edge of the pool chamber;

at least one mechanism configured for positioning a selected portion of a semiconductor component over the upward facing opening at a preselected height above the peripheral edge of the pool chamber; and a metering mechanism proximate to the at least one flowable material reservoir comprising a moveable wiper drawable across the upward facing opening of the pool chamber at a preselected height therefrom.

* * * * *

UNITED STATES PATENT AND TRADEMARK OFFICE
CERTIFICATE OF CORRECTION

| | | |
|---|---|---|
| PATENT NO. | : 6,346,152 B1 | |
| DATED | : February 12, 2002 | |
| INVENTOR(S) | : Walter L. Moden et al. | |

It is certified that error appears in the above-identified patent and that said Letters Patent is hereby corrected as shown below:

<u>Drawings,</u>
FIGURE 10, extend the lead line of "128" (both occurrences) to better indicate the position of the sides 128.

<u>Column 9,</u>
Line 36, before "facing" change "upwardly" to -- upward --
Line 50, change "upwardly" to -- upward -- and change "open" to -- opening --
Line 51, at the beginning of the line, delete "portion"
Line 61, change "upper most" to -- uppermost --

<u>Column 11,</u>
Line 7, before "facing" change "upwardly" to -- upward --
Line 16, change "upwardly" to -- upward -- and change "open" to -- opening --
Line 17, at the beginning of the line, delete "portion"
Line 28, change "upper most" to -- uppermost --

<u>Column 12,</u>
Line 42, change "upwardly" to -- upward --
Line 51, change "upwardly" to -- upward -- and change "open" to -- opening --
Line 52, at the beginning of the line, delete "portion"
Line 63, change "upper most" to -- uppermost --

<u>Column 13,</u>
Line 56, change "upwardly" to -- upward --

<u>Column 14,</u>
Line 2, change "upwardly" to -- upward -- and change "open" to -- opening --
Line 3, at the beginning of the line, delete "portion"
Line 13, change "upper most" to -- uppermost --

<u>Column 15,</u>
Line 20, change "upwardly" to -- upward --
Line 33, change "upwardly" to -- upward -- and change "open portion" to
-- opening --
Line 42, change "upper most" to -- uppermost --

<u>Column 16,</u>
Line 54, change "upwardly" to -- upward --
Line 62, change "upwardly" to -- upward -- and change "open portion" to
-- opening --

UNITED STATES PATENT AND TRADEMARK OFFICE
CERTIFICATE OF CORRECTION

PATENT NO. : 6,346,152 B1
DATED : February 12, 2002
INVENTOR(S) : Walter L. Moden et al.

It is certified that error appears in the above-identified patent and that said Letters Patent is hereby corrected as shown below:

Column 17,
Line 4, change "upper most" to -- uppermost --

Signed and Sealed this

Nineteenth Day of July, 2005

JON W. DUDAS
*Director of the United States Patent and Trademark Office*